(12) United States Patent
Matsuda et al.

(10) Patent No.: US 9,812,476 B2
(45) Date of Patent: Nov. 7, 2017

(54) PHOTOELECTRIC TRANSDUCER AND IMAGING SYSTEM

(71) Applicant: CANON KABUSHIKI KAISHA, Tokyo (JP)

(72) Inventors: Takashi Matsuda, Yokohama (JP); Sho Suzuki, Yokohama (JP); Hidekazu Takahashi, Zama (JP); Nobuhiko Sato, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 92 days.

(21) Appl. No.: 14/811,610

(22) Filed: Jul. 28, 2015

(65) Prior Publication Data

US 2016/0035767 A1 Feb. 4, 2016

(30) Foreign Application Priority Data

Jul. 31, 2014 (JP) ................. 2014-156785

(51) Int. Cl.
*H04N 5/335* (2011.01)
*H04N 5/228* (2006.01)
*H01L 27/148* (2006.01)
*H01L 29/80* (2006.01)
*H01L 27/146* (2006.01)
*H01L 31/0352* (2006.01)

(52) U.S. Cl.
CPC .... *H01L 27/1461* (2013.01); *H01L 27/14612* (2013.01); *H01L 27/14621* (2013.01); *H01L 27/14623* (2013.01); *H01L 27/14627* (2013.01); *H01L 27/14636* (2013.01); *H01L 27/14643* (2013.01); *H01L 27/14665* (2013.01); *H01L 27/14687* (2013.01); *H01L 31/035218* (2013.01)

(58) Field of Classification Search
CPC .................. H04N 5/372; H04N 1/193; H04N 2201/02429; H04N 5/374; H04N 5/2251; H04N 5/335; H01L 27/148; H01L 29/762; H01L 27/14643
USPC ....... 257/222, 223, 225–234, 257, 258, 292, 257/294; 348/308, 294
See application file for complete search history.

(56) References Cited

U.S. PATENT DOCUMENTS

| | | | |
|---|---|---|---|
| 2006/0118795 A1 | 6/2006 | Araki | |
| 2007/0012955 A1 | 1/2007 | Ihama | |
| 2008/0054388 A1* | 3/2008 | Nakata | H01L 27/14632 257/432 |
| 2008/0198284 A1* | 8/2008 | Oyamada | G02F 1/136213 349/39 |

(Continued)

FOREIGN PATENT DOCUMENTS

| | | |
|---|---|---|
| JP | 2007-208840 A1 | 8/2007 |
| JP | 2012-209421 A | 10/2012 |

*Primary Examiner* — Xi Wang
(74) *Attorney, Agent, or Firm* — Canon U.S.A. Inc., IP Division

(57) ABSTRACT

A photoelectric transducer includes a wiring structure and a photoelectric conversion section provided on a substrate. The photoelectric conversion section includes a first electrode and a photoelectric conversion layer provided on the first electrode. The wiring structure includes a first wiring layer including a wiring pattern. The distance between the bottom face of the first electrode and the substrate is shorter than the distance between the bottom face of the wiring pattern and the substrate.

10 Claims, 9 Drawing Sheets

(56) References Cited

U.S. PATENT DOCUMENTS

| | | | |
|---|---|---|---|
| 2009/0289281 A1* | 11/2009 | Wada | H01L 21/76816 257/208 |
| 2010/0134646 A1* | 6/2010 | Tamura | H01L 27/14623 348/222.1 |
| 2010/0187501 A1* | 7/2010 | Toda | B82Y 20/00 257/21 |

* cited by examiner

PHOTOELECTRIC TRANSDUCER AND IMAGING SYSTEM

BACKGROUND OF THE INVENTION

Field of the Invention

The present invention relates to a photoelectric transducer and an imaging system using the photoelectric transducer.

Description of the Related Art

There is known a photoelectric transducer that uses a photoelectric conversion layer. Japanese Patent Laid-Open No. 2012-209421 discloses a configuration in which a photoelectric conversion section is provided on a semiconductor substrate, and the photoelectric conversion section has a photoelectric conversion layer disposed between two transparent electrodes. Further, Japanese Patent Laid-Open No. 2012-209421 discloses that a film surface of the photoelectric conversion layer is provided tilted with respect to the substrate in order to reduce sensitivity reduction.

Japanese Patent Laid-Open No. 2012-209421 does not discuss the details of the positional relationship between electrodes on the photoelectric conversion section and a wiring layer. The capacitance of a signal path between the electrodes on the photoelectric conversion section and a reading element may increase due to a parasitic capacitance generated between the signal path and the wiring layer. The greater the capacitance of the signal path, the greater the noise superimposed on a signal, and the lower the driving speed in a reading and/or resetting operation.

SUMMARY OF THE INVENTION

The present invention reduces an increase in the capacitance of a signal path.

According to an aspect of the present invention, there is provided a photoelectric transducer including a substrate, a photoelectric conversion section, a reading circuit, a peripheral circuit, a first wiring layer, a first connection section, and a second connection section. The substrate includes a first area and a second area, and has a surface. The photoelectric conversion section is provided on the surface in the first area and includes a first electrode and a photoelectric conversion layer provided on the first electrode. The reading circuit is provided in the first area. The peripheral circuit is provided in the second area. The first wiring layer is provided on the surface in the second area and includes a wiring pattern. The first connection section contacts a bottom face of the first electrode, is made of an electric conductor, and is electrically connected to the photoelectric conversion layer and the reading circuit. The second connection section contacts a bottom face of the wiring pattern, is made of an electric conductor, and is electrically connected to the peripheral circuit. A shortest distance between the bottom face of the first electrode and the surface is shorter than a shortest distance between the bottom face of the wiring pattern and the surface. A number of wiring layers provided between the first electrode and the surface in the first area is less than a number of wiring layers provided between the first wiring layer and the surface in the second area.

Further features of the present invention will become apparent from the following description of exemplary embodiments with reference to the attached drawings.

DESCRIPTION OF THE EMBODIMENTS

First Embodiment

A first embodiment will be described using FIGS. 1 and 2. For portions that are not particularly illustrated or discussed in the present specification, known or related art of the technical field shall be applied.

Figure 1:
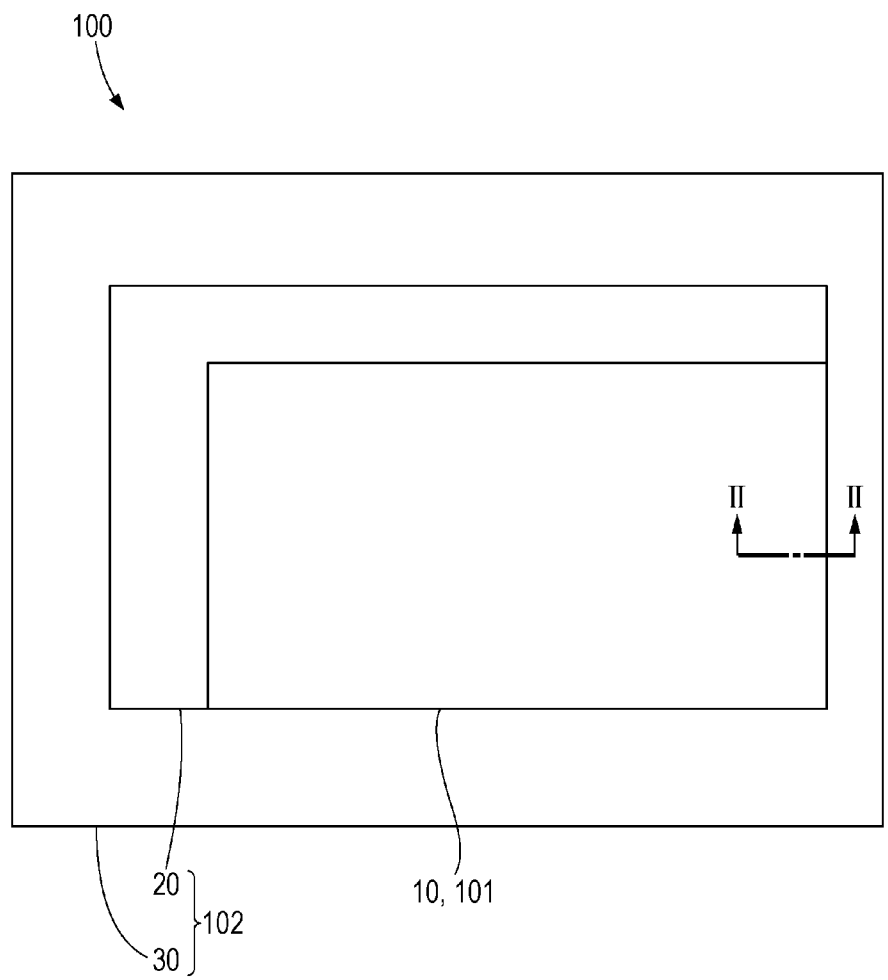
FIG. 1 is a plan schematic diagram for describing a first embodiment.

FIG. 1 illustrates a plan layout of a photoelectric transducer 100. The photoelectric transducer 100 includes a photo-receiving area 10, a light-blocked area 20, and a peripheral circuit area 30. The light-blocked area 20 is an area provided outside the photo-receiving area 10. A plurality of pixels is provided in the shape of a two-dimensional array in the photo-receiving area 10 and the light-blocked area 20. Each pixel includes at least one photoelectric conversion section, and a reading circuit for reading a signal generated in the photoelectric conversion section. The reading circuit includes, for example, a transfer transistor electrically connected to the photoelectric conversion section, an amplifying transistor including a gate electrode electrically connected to the photoelectric conversion section, and a reset transistor for resetting the photoelectric conversion section. The peripheral circuit area 30 is an area where a peripheral circuit that controls the operation of the photo-receiving area 10 and processes a signal read from the photo-receiving area 10 is provided, and includes, for example, an amplifying circuit, a horizontal scanning circuit, and a vertical scanning circuit. The light-blocked area 20 and the peripheral circuit area 30 are covered with a light-blocking film when viewed from a vertical direction with respect to the surface of a semiconductor substrate. In contrast, the photo-receiving area 10 is not covered with a light-blocking film or is covered with a light-blocking film that is open at each pixel when viewed from a vertical direction with respect to the surface of the semiconductor substrate (when viewed in plan). At least some of the pixels arranged in the light-blocked area 20 are optical black pixels (OPB pixels), and signals obtained by the OPB pixels are used as noise signals. In other words, the areas can be divided into two areas. An area 101 includes the photo-receiving area 10, and the other area 102 includes the light-blocked area 20 and the peripheral circuit area 30. The area 102 is provided outside the area 101.

Figure 2:
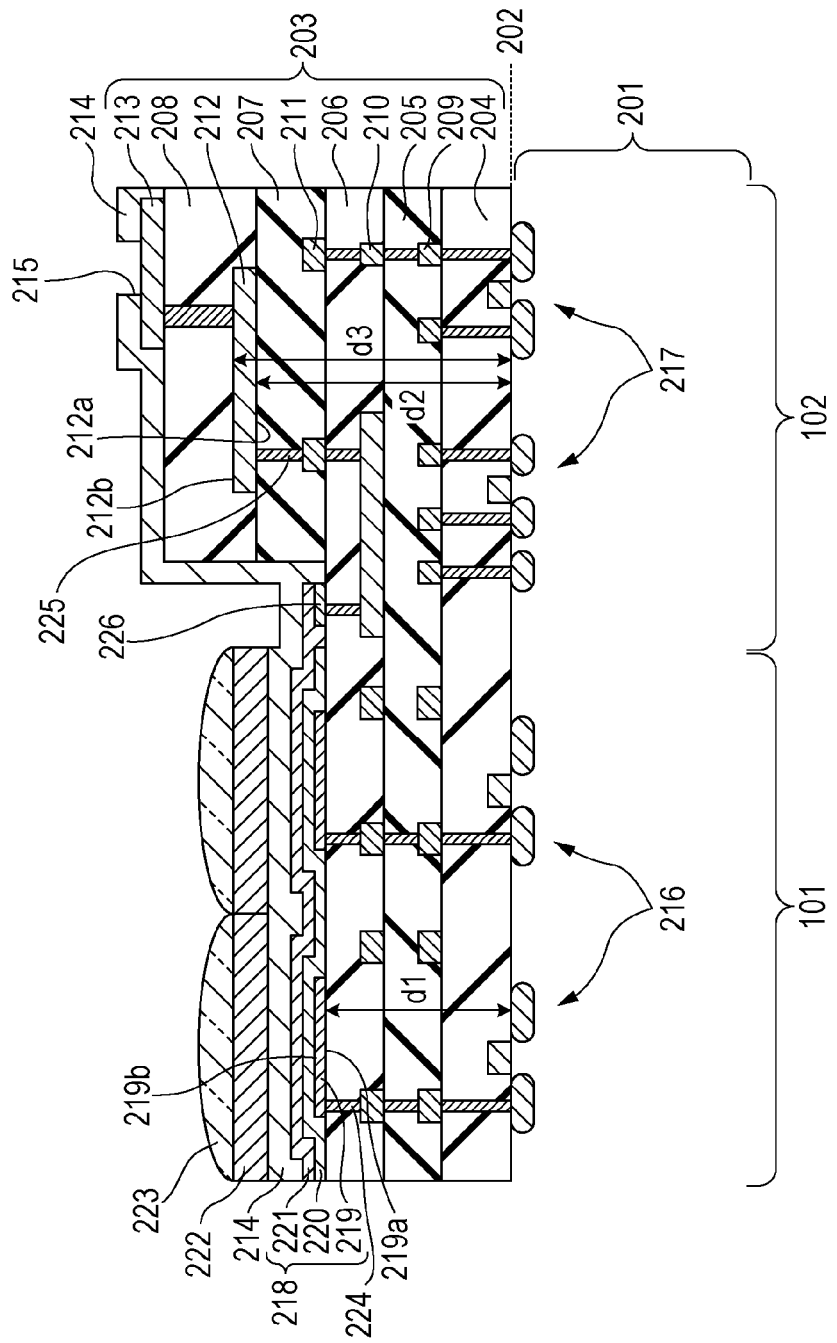
FIG. 2 is a sectional schematic diagram for describing the first embodiment.

FIG. 2 is a cross-sectional view of a II-II portion of the plan layout illustrated in FIG. 1. The II-II portion is a portion across the area 101 including the photo-receiving area 10, and the area 102 including the peripheral circuit area 30. In the area 101, a plurality of photoelectric conversion sections 218 is provided on a semiconductor substrate (hereinafter may also be referred to as a "substrate") 201. Here, two photoelectric conversion sections are illustrated. The two photoelectric conversion sections 218 are arranged along a surface 202 of the substrate 201. Here, a direction that is perpendicular to the surface 202 and that becomes away from the surface 202 is referred to as an upper direction, and a direction that is perpendicular to the surface 202 and that is directed toward the substrate interior is referred to as a lower direction. With reference to the surface 202, an upper distance may also be referred to as a height.

Each photoelectric conversion section 218 includes an electrode 219, a photoelectric conversion layer 220, and an electrode 221. The electrode 219 is also referred to as a lower electrode, and is composed of an electric conductor that includes aluminum or copper as a main ingredient. The electrode 221 is also referred to as an upper electrode. It is preferable that the electrode 221 be made of a transparent electrically conductive material, and the electrode 221 is composed of an electric conductor that includes, for example, indium tin oxide (ITO) or polyimide as a main ingredient. The electrode 221 is electrically connected to the peripheral circuit via an electrode 226. The photoelectric conversion layer 220 is made of, for example, an inorganic or organic material that is capable of converting light to current. In the case of an inorganic material, for example, an amorphous silicon layer, an amorphous selenium layer, a quantum dot layer, or a compound semiconductor layer can be arbitrarily selected as the photoelectric conversion layer 220. In the case of an organic material, for example, a pigment such as a metal complex pigment or a pigment of the cyanin family may be used as the material of the photoelectric conversion layer 220. Other organic materials include derivatives such as acridine, coumarin, triphenylmethane, fullerene, aluminum quinoline, polyparaphenylene vinylene, polyfluorene, polyvinyl carbazole, polythiol, polypyrrole, and polythiophene. In this embodiment, the quantum dot layer is employed. For example, the quantum dot layer includes an AlGaAs or GaAs buffer material, and InAs or InGaAs quantum dots. A plurality of transistors 216 is arranged on the substrate 201 in the area 101. A plurality of transistors 217 is arranged on the substrate 201 in the area 102. The plurality of transistors 217 constitutes the above-mentioned processing circuit.

A wiring structure 203 is provided on the surface 202 of the substrate 201. The wiring structure 203 includes at least one wiring layer. Here, the wiring structure 203 includes insulating films 204 to 206 that are successively provided in the area 101 and the area 102, and insulating films 207 and 208 that are provided in the area 102, but not in the area 101. The wiring structure 203 further includes wiring layers 209 and 210 that are provided in both the area 101 and the area 102, and wiring layers 211, 212, and 213 that are provided in the area 102, but not in the area 101. The wiring layers are positioned at different heights, and have at least one wiring pattern. The wiring layer 212 functions in the area 102 as, for example, a light-blocking film that reduces light that may enter, in at least part of the area 102, the substrate 201 in the area 102. In addition, the wiring layer 213 becomes a terminal (pad portion) for external connection. A protective film 214 covers the wiring layer 213 from above the photoelectric conversion section 218 in the area 101, and has an opening 215 that exposes part of the top face of the wiring layer 213. A color filter layer 222 and a microlens layer 223 are provided on the protective film 214 in the area 101. The color filter layer 222 includes a plurality of color filters, and the microlens layer 223 includes a plurality of microlenses.

The electrode 219 of the photoelectric conversion section 218 is electrically connected to one or some of transistors of a reading circuit provided on the substrate 201 via the wiring layer 210 and a plug made of an electric conductor. Here, the electrode 219 has a bottom face 219a and a top face 219b. The bottom face 219a contacts a plug 224 (connection section) and is electrically connected to the plug 224. The plug 224 is electrically connected to one or some of the transistors provided on the substrate 201 via another wiring layer. A signal generated in the photoelectric conversion section 218 is transmitted via the wiring layer 210 to one or some of the transistors. The electrode 221 is electrically connected to the wiring layer 210 via the plug 224. At this time, the wiring layers 212 and 213 are provided at positions higher than the bottom face 219a of the electrode 219 in the area 102. A wiring pattern of the wiring layer 212 has a bottom face 212a and a top face 212b. The wiring pattern of the wiring layer 212 is electrically connected to a peripheral circuit provided on the substrate 201 via the wiring layer and a plug made of an electric conductor. The bottom face 212a of the wiring pattern of the wiring layer 212 contacts a plug 225 (connection section) and is electrically connected to the plug 225. The plug 225 is electrically connected to one or some of transistors of the peripheral circuit provided on the substrate 201 via another wiring layer.

Here, the bottom face 219a of the electrode 219 is arranged at a distance d1 from the surface 202, and the bottom face 212a of the wiring layer 212 is arranged at a distance d2 from the surface 202. The distance d1 is shorter than the distance d2 (d1<d2). Here, the distance refers to the shortest distance from the surface 202 of the substrate 201 to each face. It can be said here that a signal path between the electrode 219 and the reading circuit provided on the substrate 201 is shorter than a signal path between the wiring layer 212 and the peripheral circuit provided on the substrate 201. The longer the distance between the electrode 219 and the substrate 201, the longer the signal path formed by the wiring layer and the plug, and hence, the greater the area of the conductor and the greater the capacitance. It is thus preferable that the distance d1 be shorter than the distance d2. With the above-described configuration, an increase in the capacitance of a signal path in the photoelectric conversion section 218 can be reduced. For example, in the case where the photoelectric conversion section 218 is electrically connected to the source of each transistor 216, a time constant (RC) becomes small. Therefore, a speed in resetting the signal path via the transistors 216 becomes faster. Because the capacitance at the same node as the photoelectric conversion layer is reduced, thermal noise (KTC noise) can be reduced. Further, the number of wiring layers that may exist between the electrode 219 and the substrate 201 (including the case where the number of wiring layers is zero, that is, no wiring layer is provided) is less than the number of wiring layers that exist between the wiring layer 212 and the substrate 201. Because the number of wiring layers including a signal path from the electrode 219 to the substrate 201 is small, parasitic capacitance generated between the signal path and the wiring layers can be reduced. Since many circuits are provided in the peripheral circuit in the area 102, it is desirable to maintain or increase the number of wiring layers. According to the configuration of this embodiment, an increase in the capacitance of the signal path can be reduced without reducing the number of wiring layers in the area 102. With the above-described configuration, the resistance (R) of a signal path between the photoelectric conversion section 218 and the substrate 201 can also be reduced.

According to this embodiment, the distance between the top face of the electrode 221 and the surface 202 is shorter than the distance between the bottom face 212a of the wiring layer 212 and the surface 202. With the above-described configuration, the distance between the photoelectric conversion section 218 and the substrate 201 can be reduced. In addition, the distance between the top face of the electrode 221 and the surface 202 may be longer than the distance between the bottom face 212a of the wiring layer 212 and the surface 202 and may be shorter than the distance d3 between the top face 212b of the wiring layer 212 and the surface 202. With the above-described configuration, unevenness between the area 101 and the area 102 can be reduced. In addition, the distance between the top face of the electrode 221 and the surface 202 may be equal to the distance between the top face 212b of the wiring layer 212 and the surface 202. With the above-described configuration, unevenness between the area 101 and the area 102 can be further reduced. In addition, the electrode 221 may be positioned at the same height as the electrode 219. Although the configuration including the area 101 and the area 102 has been discussed, for example, the distance between the bottom face 219a of the electrode 219 and the substrate 201 may be shorter than the distance between the bottom face of the wiring layer 210 and the substrate 201 in the area 101.

This embodiment has discussed an example of a transfer transistor serving as a transistor in the reading circuit, and the configuration in which the electrode 219 of the photoelectric conversion section 218 is connected to the source of the transfer transistor. The drain of the transfer transistor may be connected to a signal line or an amplifying circuit. A portion where the electrode 219 of the photoelectric conversion section 218 is connected may be connected to, for example, the gate electrode of an amplifying transistor included in a source-follower circuit, but the configuration is not limited thereto.

Second Embodiment

Figure 3:
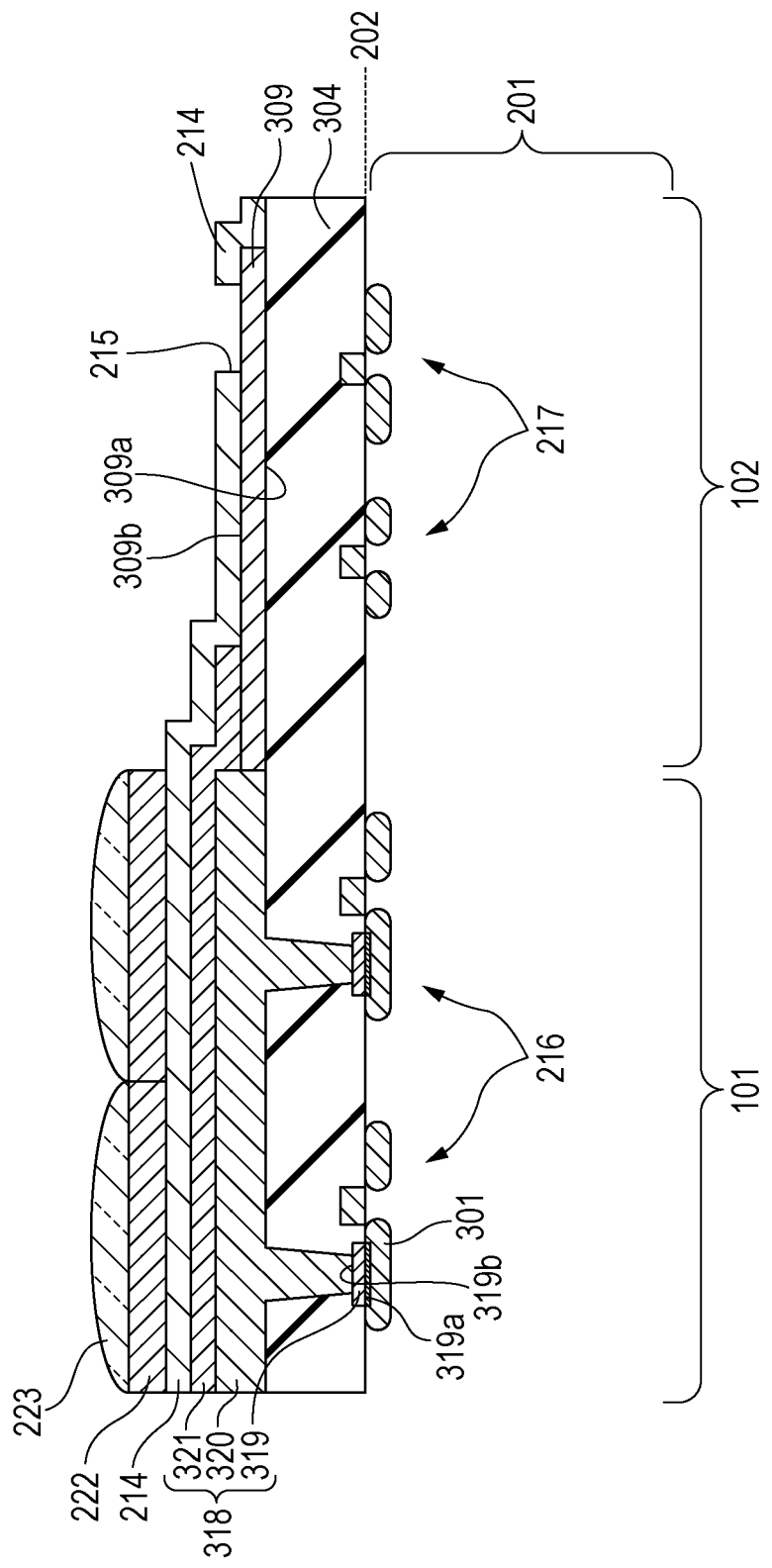
FIG. 3 is a sectional schematic diagram for describing a second embodiment.

A second embodiment will be described using FIG. 3. In this embodiment, the same configuration as that of the first embodiment is given the same reference numeral, and a description thereof is omitted.

A photoelectric conversion section 318 of this embodiment includes an electrode 319, a photoelectric conversion layer 320 provided thereon, and an electrode 321 provided on the photoelectric conversion layer 320. Here, the electrode 319 is provided directly on the surface 202 of the substrate 201 and is electrically connected to a semiconductor area 301. In short, in this embodiment, there is no connection section that contacts the bottom face of the electrode 319. An insulating film 304 is provided on the surface 202 and is provided across the area 101 and the area 102. The photoelectric conversion layer 320 fills in openings provided in the insulating film 304, is electrically connected to the electrode 319, and covers over the insulating film 304 in the area 101 except for the openings. The electrode 321 covers the photoelectric conversion layer 320 and is electrically connected to a wiring layer 309 provided in the area 102. The protective film 214 extends over from the electrode 321 to the wiring layer 309 across the area 101 and the area 102. The protective film 214 has the opening 215, which exposes part of the top face of the wiring layer 309, and the wiring layer 309 functions as a terminal. Here, there may be a connection section (not illustrated) that contacts the bottom face of another wiring pattern included in the wiring layer 309. In this embodiment, a bottom face 319a of the electrode 319 is positioned closer to the substrate 201 than a bottom face 309a of the wiring layer 309. In other words, the distance between the bottom face 319a and the surface 202 is shorter than the distance between the bottom face 309a and the surface 202. In addition, a top face 319b of the electrode 319 is positioned closer to the substrate 201 than the bottom face 309a of the wiring layer 309, and the top face 319b of the electrode 319 is positioned closer to the substrate 201 than a top face 309b of the wiring layer 309. In short, the distance between the top face 319b and the surface 202 is shorter than the distance between the bottom face 309a and the surface 202, and the distance between the top face 319b and the surface 202 is shorter than the distance between the top face 309b and the surface 202. With the above-mentioned configuration, an increase in the capacitance of the signal path can be even more reduced.

Third Embodiment

Figure 4:
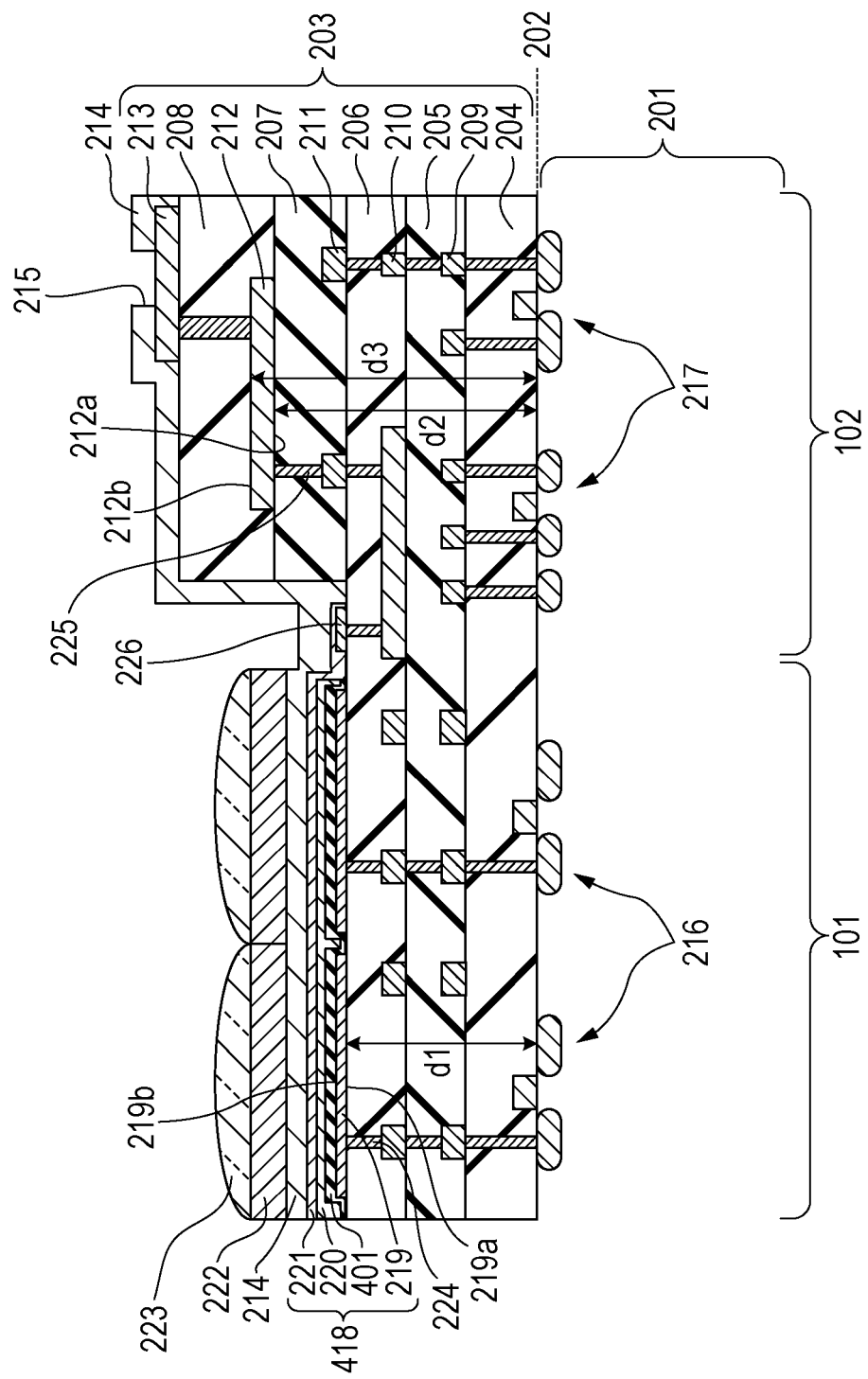
FIG. 4 is a sectional schematic diagram for describing a third embodiment.

A third embodiment will be described using FIG. 4. In this embodiment, the same configuration as that of the first embodiment is given the same reference numeral, and a description thereof is omitted.

A photoelectric conversion section 418 of this embodiment is different from the first embodiment in the point that there is an MIS structure having an insulating film 401 between the electrode 219 and the photoelectric conversion layer 220. The insulating film 401 is a conformal film made of silicon dioxide and has a top face that follows the shape of the electrode 219. Even with the above-mentioned configuration, an increase in the capacitance of the signal path can be reduced, as in the first embodiment.

Fourth Embodiment

Figure 5:
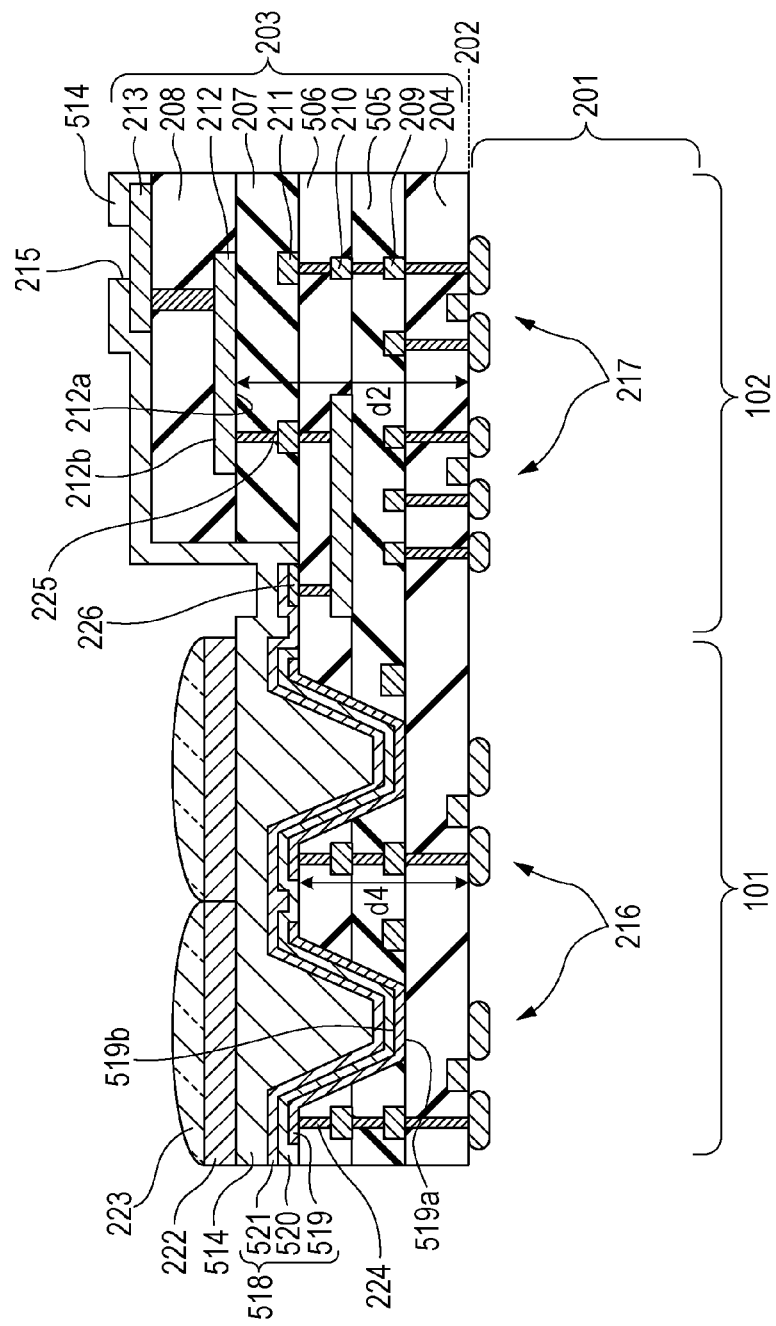
FIG. 5 is a sectional schematic diagram for describing a fourth embodiment.

A fourth embodiment will be described using FIG. 5. In this embodiment, the same configuration as that of the first embodiment is given the same reference numeral, and a description thereof is omitted.

A photoelectric conversion section 518 of this embodiment includes an electrode 519, a photoelectric conversion layer 520 provided on the electrode 519, and an electrode 521 provided on the photoelectric conversion layer 520. Here, an insulating film 505 and an insulating film 506 in the area 101 have openings, and the photoelectric conversion section 518 is provided along the side and bottom faces of the openings. A protective film 514 is provided on the photoelectric conversion section 518 in the openings.

A distance d4 between a bottom face 519a of the electrode 519 and the surface 202 is shorter than the distance d2 between the bottom face 212a of the wiring layer 212 and the surface 202. With the above-mentioned configuration, an increase in the capacitance of the signal path can be even more reduced.

Note that the protective film 514 may also function as a planarizing layer for the openings. A top face 519b of the electrode 519 is closer to the surface 202 than the bottom face 212a of the wiring layer 212. The distance between the top face 519b and the surface 202 is shorter than the distance between the bottom face 212a and the surface 202.

Fifth Embodiment

Figure 6:
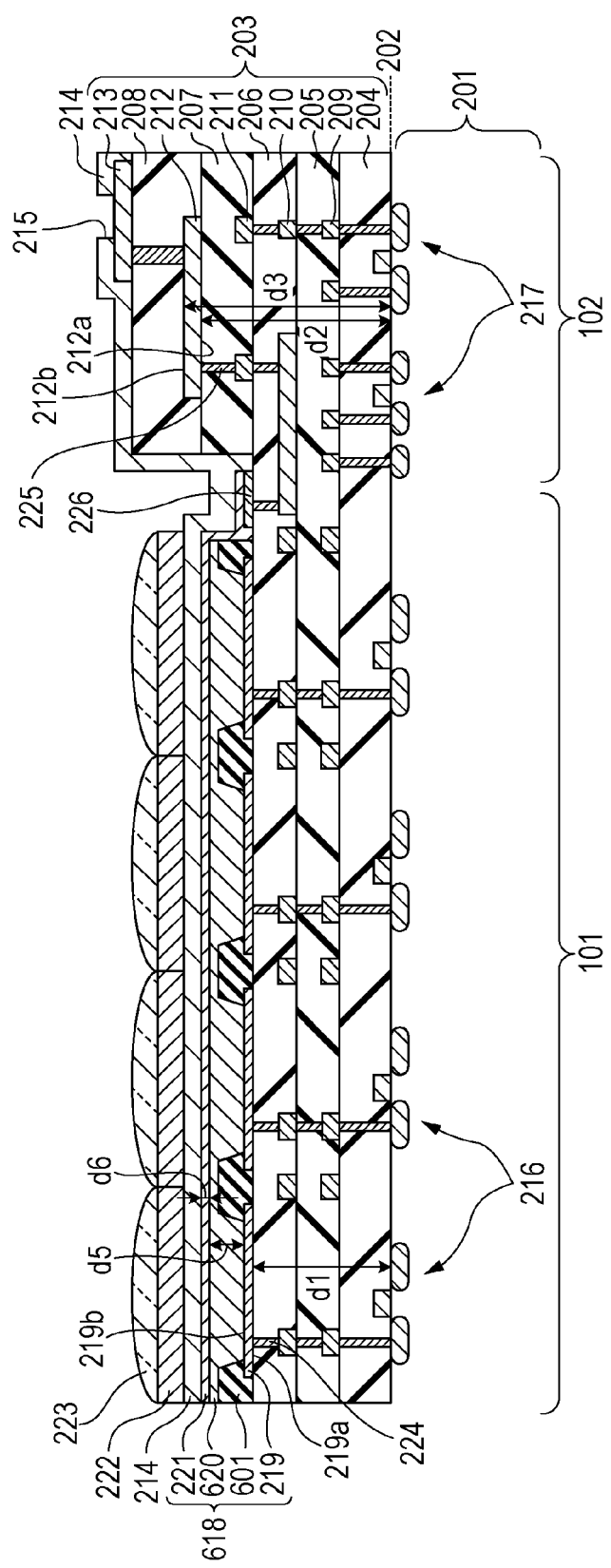
FIG. 6 is a sectional schematic diagram for describing a fifth embodiment.

A fifth embodiment will be described using FIG. 6. In this embodiment, the same configuration as that of the first embodiment is given the same reference numeral, and a description thereof is omitted.

A photoelectric conversion section 618 of this embodiment includes the electrode 219, a photoelectric conversion layer 620 provided on the electrode 219, the electrode 221 provided on the photoelectric conversion layer 620, and an insulating film 601 having openings that expose part of the top face of the electrode 219. A side face of each opening of the insulating film 601 is positioned on the electrode 219, constitutes a boundary with the photoelectric conversion layer 620, and may function as a waveguide. At this time, the insulating film 601 is made of silicon dioxide, and the photoelectric conversion layer 620 is made of a quantum dot film. It is only necessary for these materials to be such that the refractive index of the insulating film 601 is less than the refractive index of the photoelectric conversion layer 620. With the above-described configuration, light being mixed in the adjacent photoelectric conversion layer can be reduced.

In this embodiment, the photoelectric conversion layer 620 also extends over the top face of the insulating film 601, and a distance d6 between the top face and the bottom face thereof is shorter than a distance d5 between the top face and the bottom face of the photoelectric conversion layer 620 in the openings. However, the top face of the photoelectric conversion layer 620 may be flush with the top face of the insulating film 601.

Sixth Embodiment

Figure 7:
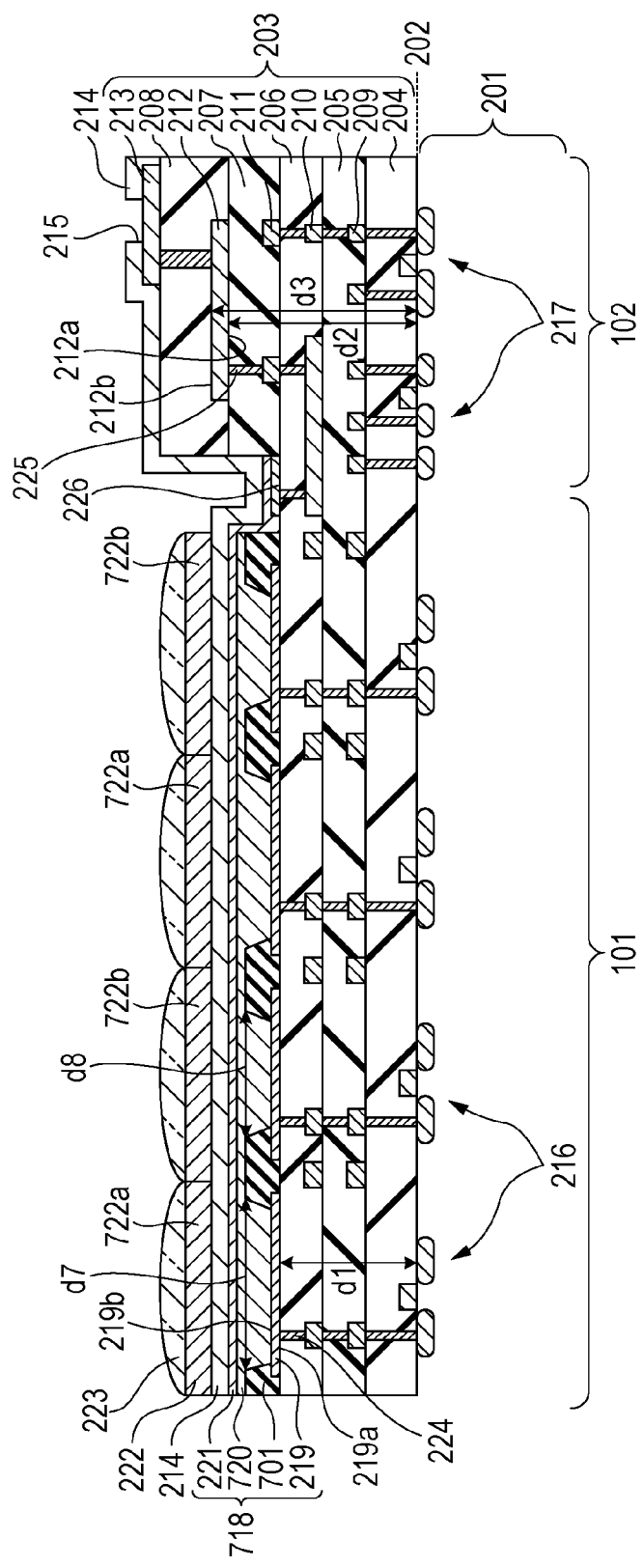
FIG. 7 is a sectional schematic diagram for describing a sixth embodiment.

A sixth embodiment will be described using FIG. 7. The sixth embodiment discusses a configuration having the waveguide structure described in the fifth embodiment. In this embodiment, the same configuration as that of the first embodiment and the fifth embodiment is given the same reference numeral, and a description thereof is omitted.

A photoelectric conversion section 718 of this embodiment includes the electrode 219, a photoelectric conversion layer 720 provided on the electrode 219, the electrode 221 provided on the photoelectric conversion layer 720, and an insulating film 701 having openings that expose part of the top face of the electrode 219. Likewise in the fifth embodiment, the insulating film 701 and the photoelectric conversion layer 720 may function as a waveguide. Here, the color filter layer 222 includes a first color filter 722a corresponding to a first color, and a second color filter 722b corresponding to a second color different from the first color. Here, the first color filter 722a and the second color filter 722b have different spectral transmittance profiles.

In the above-described configuration, the photoelectric conversion section 718 corresponding to the first color filter 722a has a width d7 of each opening in the top face of the insulating film 701, and the photoelectric conversion section 718 corresponding to the second color filter 722b has a width d8 of each opening in the top face of the insulating film 701. Here, the width d7 of each opening is different from the width d8 of each opening. The relationship between the width d7 and the width d8 will be discussed below. For example, in a color filter layer 722 corresponding to visible light, the following configuration is adopted in order to have similar sensitivities when white light enters. In the case where the amount of light passing through the first color filter 722a is less than the amount of light passing through the second color filter 722b, the width d7 is made wider than the width d8. For example, in the color filter layer 722 corresponding to visible light, the following configuration is adopted in order to reduce mixing of colors due to diffraction of light. In the case where the wavelength of light passing through the second color filter 722b is longer than the wavelength of light passing through the first color filter 722a, the width d7 is made wider than the width d8.

In this manner, the width of each opening can be changed in accordance with the characteristics of the color filter layer 722. Note that the width of each opening is a length in a direction parallel with the surface 202, and is the width of the waveguide, as well. Although the width on the top face of the insulating film 701 is changed in this embodiment, the width in other portions may be changed.

Seventh Embodiment

Figure 8:
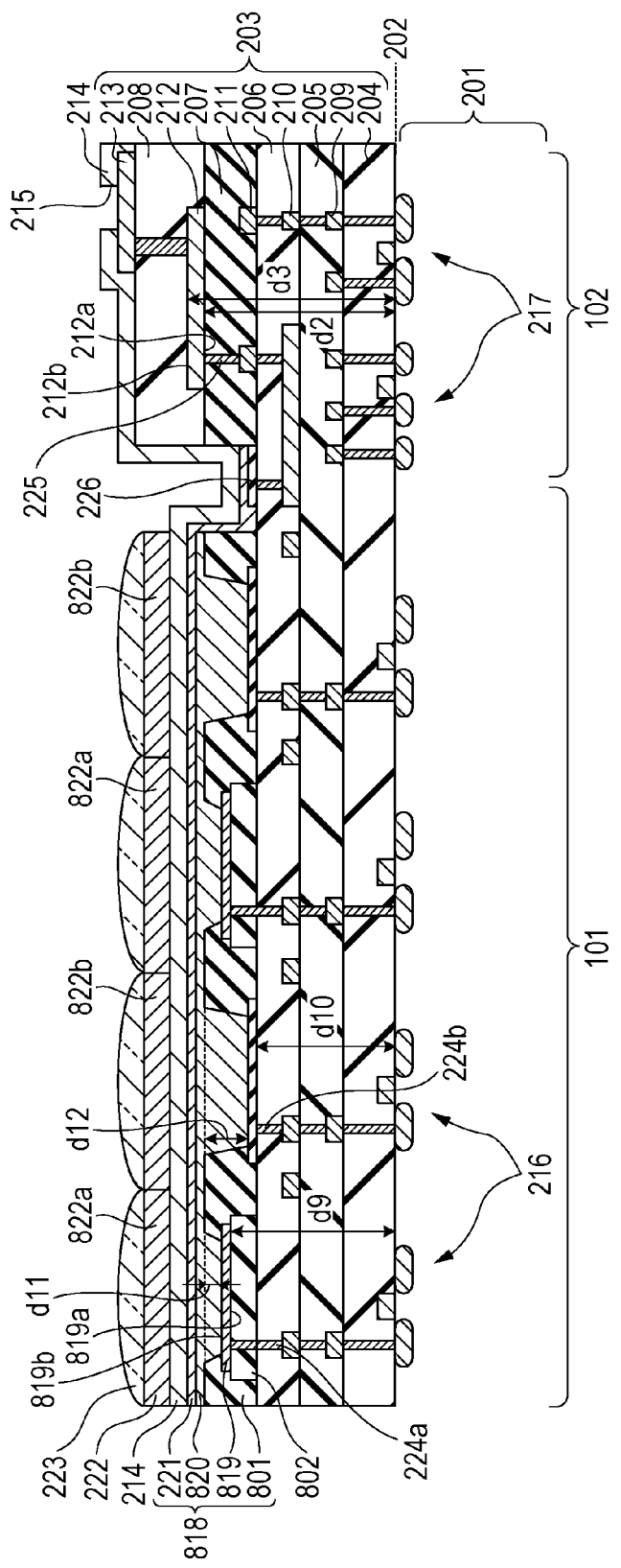
FIG. 8 is a sectional schematic diagram for describing a seventh embodiment.

A seventh embodiment will be described using FIG. 8. The seventh embodiment discusses a configuration having the waveguide structure described in the fifth embodiment and is different in the point that the height of the waveguide is changed. The seventh embodiment is different from the sixth embodiment in the point that whether the width or the height of the waveguide is changed. In this embodiment, the same configuration as that of the first embodiment, the fifth embodiment, and the sixth embodiment is given the same reference numeral, and a description thereof is omitted.

A photoelectric conversion section 818 of this embodiment includes the electrode 219, a photoelectric conversion layer 820 provided on the electrode 219, the electrode 221 provided on the photoelectric conversion layer 820, and an insulating film 801 having openings that expose part of the top face of the electrode 219. Likewise in the fifth embodiment, the insulating film 801 and the photoelectric conversion layer 820 may function as a waveguide. Here, the color filter layer 222 includes a first color filter 822a corresponding to a first color, and a second color filter 822b corresponding to a second color different from the first color. Here, the first color filter 822a and the second color filter 822b have different spectral transmittance profiles.

In the above-described configuration, an insulating film 802 is provided below an electrode of the photoelectric conversion section 818 corresponding to the first color filter 822a. A bottom face 819a of the electrode 819 contacts a plug 224a (connection section). With the insulating film 802, the distance between the bottom face 819a of the electrode 819 and the surface 202 becomes a distance d9. The photoelectric conversion layer 820 corresponding to the first color filter 822a has a thickness equivalent to a distance d11 that is a height from a top face 819b of the electrode 819 to the top face of the insulating film 801. In contrast, the photoelectric conversion section 818 corresponding to the second color filter 822b is not provided on the insulating film 802, and the distance between the bottom face 819a of the electrode 819 and the surface 202 has a distance d10. Here, the distance d9 is greater than the distance d10. The photoelectric conversion layer 820 corresponding to the second color filter 822b has a thickness equivalent to a distance d12 that is a height from the top face 819b of the electrode 819 to the top face of the insulating film 801. Here, the distance d11 is thinner than the distance d12. In this manner, the height of the waveguide can be changed in accordance with the characteristics of the color filter layer 722.

The waveguide height relationship will be discussed below. For example, it is preferable that the depth be changed in accordance with each color filter included in the color filter layer 822 and light absorption of the photoelectric conversion layer 820. For example, it is preferable that the distance d12 be greater than the distance d11 in the case where the second color filter 822b is provided in order to pass light having a wavelength longer than that of the first color filter 822a, and the photoelectric conversion layer 820 is an amorphous silicon layer.

In this manner, the height of the waveguide can be changed in accordance with the characteristics of the color filter layer 822. Although the photoelectric conversion layer 820 extends over the top face of the insulating film 801, the photoelectric conversion layer 820 may extend only in the openings, that is, the photoelectric conversion layer 820 may have a configuration with a top face that is flush with the top face of the insulating film 801.

A manufacturing method according to this embodiment is such that, after an insulating film 206 is formed, an insulating film 802 is formed, and then an electrode 819 is formed. This embodiment may be combined with the sixth embodiment.

Eighth Embodiment

An eighth embodiment will be described using FIGS. 9A and 9B. The eighth embodiment is different from the sixth embodiment or the seventh embodiment in the thickness of the photoelectric conversion layer. In this embodiment, the same configuration as that of the first embodiment, the sixth embodiment, and the seventh embodiment is given the same reference numeral, and a description thereof is omitted.

Figure 9A:
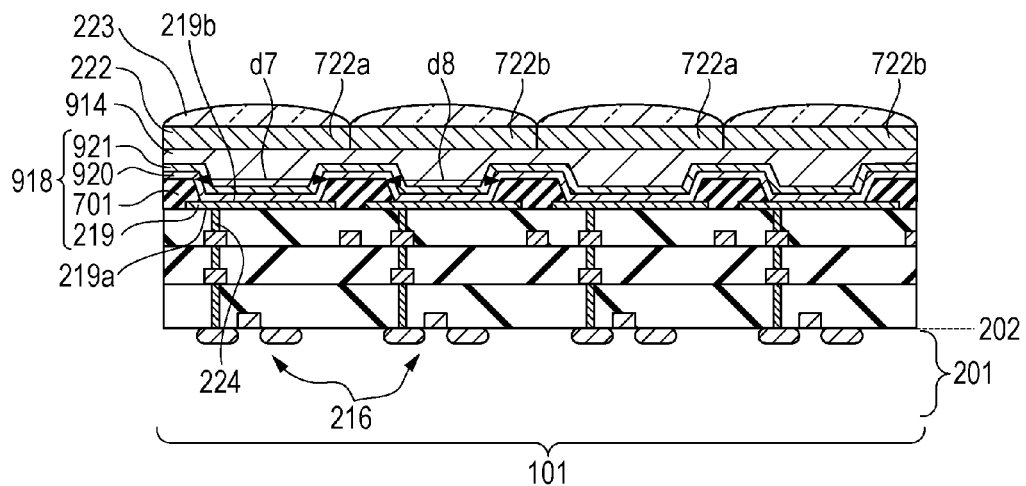
FIGS. 9A and 9B are sectional schematic diagrams for describing an eighth embodiment.

FIG. 9A is a diagram corresponding to the sixth embodiment. Referring to FIG. 9A, a photoelectric conversion section 918 includes the electrode 219, the insulating film 701, a photoelectric conversion layer 920, and an electrode 921. Here, the photoelectric conversion layer 920 covers, from the top face of the insulating film 701, the side faces of openings in the insulating film 701 and covers over the electrode 219, and is a conformal film having a top face that follows the shape of the insulating film 701. Similarly, the electrode 921 is formed as a conformal film having a top face that follows the shape of the top face of the photoelectric conversion layer 920. A protective film 914 fills in recesses in the top face of the electrode 921, along with the top face of the electrode 921, and functions as a planarizing film in the area 101.

Figure 9B:
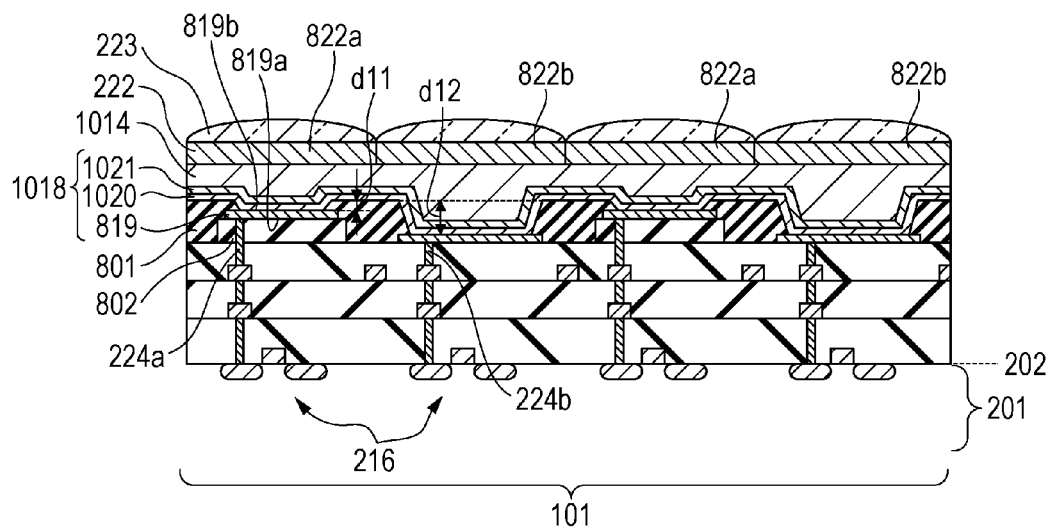

FIG. 9B is a diagram corresponding to the seventh embodiment. Referring to FIG. 9B, a photoelectric conversion section 1018 includes the electrode 819, the insulating film 801, a photoelectric conversion layer 1020, and an electrode 1021. Here, the photoelectric conversion layer 1020 covers, from the top face of the insulating film 801, the side faces of openings in the insulating film 801 and covers over the electrode 819, and is a conformal film having a top face that follows the shape of the insulating film 801. Similarly, the electrode 1021 is formed as a conformal film having a top face that follows the shape of the top face of the photoelectric conversion layer 1020. A protective film 1014 fills in recesses in the top face of the electrode 1021, along with the top face of the electrode 1021, and functions as a planarizing film in the area 101. Even with the abovementioned configuration, an increase in the capacitance of the signal path can be reduced, as in the first embodiment.

Hereinafter, an imaging system including the photoelectric transducer according to the above-described embodiments will be described as an exemplary application of the photoelectric transducer. Concepts of the imaging system include not only devices that capture images as their main functions, such as cameras, but also devices that have an image capturing function as an auxiliary function (such as personal computers and mobile phones). The imaging system includes a photoelectric transducer according to the present invention, illustrated by way of example in the above-described embodiments, and a signal processor that processes a signal output from the photoelectric transducer. The signal processor may include an analog-to-digital (A/D) converter, and a processor that processes digital data output from the A/D converter.

Although the embodiments have described the substrate as a semiconductor substrate by way of example, a glass substrate or a flexible substrate on which a circuit is formed may be used. An area having wiring layers positioned higher than the lower electrode is not limited to the area 102. However, when the area 102 has wiring layers, manufacturing the configuration according to the above embodiments becomes easier. In addition, an insulating film or a protective film may include one or more layers, and each layer may be made of a different material. The first to eighth embodiments may be combined as needed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-156785, filed Jul. 31, 2014 which is hereby incorporated by reference herein in its entirety.

What is claimed is:

1. A photoelectric transducer comprising:
a substrate including a first area and a second area, the substrate having a surface;
a photoelectric conversion section provided on the surface in the first area and including a first electrode and a photoelectric conversion layer provided on the first electrode;
a reading circuit provided in the first area;
a peripheral circuit provided in the second area;
a first wiring layer provided on the surface in the second area and including a wiring pattern;
a first connection section that contacts a bottom face of the first electrode, is made of an electric conductor, and is electrically connected to the photoelectric conversion layer and the reading circuit; and
a second connection section that contacts a bottom face of the wiring pattern, is made of an electric conductor, and is electrically connected to the peripheral circuit,
wherein a shortest distance between the bottom face of the first electrode and the surface is shorter than a shortest distance between the bottom face of the wiring pattern and the surface, and
wherein a number of wiring layers provided between the first electrode and the surface in the first area is less than a number of wiring layers provided between the first wiring layer and the surface in the second area.

2. The photoelectric transducer according to claim 1, wherein the photoelectric conversion section includes a second electrode provided on the photoelectric conversion layer.

3. The photoelectric transducer according to claim 2, wherein a shortest distance between a top face of the second electrode and the surface is shorter than a shortest distance between the bottom face of the wiring pattern and the surface.

4. The photoelectric transducer according to claim 2, wherein a shortest distance between a top face of the second electrode and the surface is longer than a shortest distance between the bottom face of the wiring pattern and the surface and is shorter than a shortest distance between a top face of the wiring pattern and the surface.

5. The photoelectric transducer according to claim 2, wherein a shortest distance between a top face of the second electrode and the surface is equal to a shortest distance between a top face of the wiring pattern and the surface.

6. The photoelectric transducer according to claim 1, wherein the first wiring layer functions as a light blocking film that reduces light entering part of the second area.

7. The photoelectric transducer according to claim 1, wherein the photoelectric conversion layer is a quantum dot layer.

8. The photoelectric transducer according to claim 1, wherein the photoelectric conversion section includes an insulating film between the first electrode and the photoelectric conversion layer.

9. An imaging system comprising:
   the photoelectric transducer according to claim 1; and
   a signal processor that processes a signal from the photoelectric transducer.

10. A photoelectric transducer comprising:
    a substrate including a first area and a second area, the substrate having a surface;
    a photoelectric conversion section provided on the surface in the first area and including a first electrode and a photoelectric conversion layer provided on the first electrode;
    a reading circuit provided in the first area;
    a peripheral circuit provided in the second area;
    a first wiring layer provided on the surface in the second area and including a wiring pattern; and
    a connection section that contacts a bottom face of the wiring pattern, is made of an electric conductor, and is electrically connected to the peripheral circuit,
    wherein the substrate is a semiconductor substrate,
    wherein the reading circuit includes a transistor having a first semiconductor area,
    wherein the first electrode directly contacts the surface and is electrically connected to the first semiconductor area, and
    wherein a shortest distance between the bottom face of the first electrode and the surface is shorter than a shortest distance between the bottom face of the wiring pattern and the surface.

* * * * *